United States Patent
Huang et al.

(10) Patent No.: US 11,869,953 B2
(45) Date of Patent: Jan. 9, 2024

(54) HIGH VOLTAGE TRANSISTOR DEVICE AND METHOD FOR FABRICATING THE SAME

(71) Applicant: UNITED MICROELECTRONICS CORP., Hsinchu (TW)

(72) Inventors: Sheng-Yao Huang, Kaohsiung (TW); Yu-Ruei Chen, New Taipei (TW); Zen-Jay Tsai, Tainan (TW); Yu-Hsiang Lin, New Taipei (TW)

(73) Assignee: UNITED MICROELECTRONICS CORP, Hsinchu (TW)

( * ) Notice: Subject to any disclaimer, the term of this patent is extended or adjusted under 35 U.S.C. 154(b) by 0 days.

(21) Appl. No.: 17/943,654

(22) Filed: Sep. 13, 2022

(65) Prior Publication Data
US 2023/0006048 A1     Jan. 5, 2023

Related U.S. Application Data

(62) Division of application No. 17/213,868, filed on Mar. 26, 2021, now Pat. No. 11,476,343.

(30) Foreign Application Priority Data

Jan. 22, 2021    (CN) .......................... 202110086666.3

(51) Int. Cl.
    *H01L 29/423*       (2006.01)
    *H01L 21/28*        (2006.01)
    *H01L 29/06*        (2006.01)

(52) U.S. Cl.
CPC .. *H01L 29/42364* (2013.01); *H01L 21/28238* (2013.01); *H01L 29/0653* (2013.01)

(58) Field of Classification Search
CPC ......... H01L 29/06; H01L 29/40; H01L 29/66; H01L 29/94; H01L 29/423; H01L 29/401; H01L 29/42364; H01L 29/0653; H01L 29/66545; H01L 29/945; H01L 29/792; H01L 29/7923; H01L 29/66181; H01L 29/66833; H01L 29/78; H01L 29/0843; H01L 29/0891; H01L 29/66636; H01L 29/66643; H01L 29/66515; H01L 29/66878; H01L 29/66818;
(Continued)

(56) References Cited

U.S. PATENT DOCUMENTS 9,716,139 B2    7/2017   Chen et al.
10,229,993 B2    3/2019   Xia et al.
(Continued)

*Primary Examiner* — Chuong A Luu
(74) *Attorney, Agent, or Firm* — WPAT, P.C

(57) ABSTRACT

A high-voltage transistor device includes a semiconductor substrate, an isolation structure, a gate dielectric layer, a gate, a source region and a drain region. The semiconductor substrate has a plurality of grooves extending downward from a surface of the semiconductor substrate to form a sawtooth sectional profile. The isolation structure is disposed on the outside of the plurality of grooves, and extends from the surface downwards into the semiconductor substrate to define a high-voltage area. The gate dielectric layer is disposed on the high-voltage area and partially filled in the plurality of grooves. The gate is disposed on the gate dielectric layer. The source region and the drain region are respectively disposed in the semiconductor substrate and isolated from each other.

3 Claims, 8 Drawing Sheets

(58) Field of Classification Search
CPC ............... H01L 29/78391; H01L 21/28; H01L 21/28238; H01L 21/76; H01L 21/762; H01L 21/76224; H01L 21/76232; H01L 21/8234; H01L 21/8238; H01L 21/823412; H01L 21/823425; H01L 21/823807; H01L 21/823814; H01L 27/06; H01L 27/02; H01L 27/088; H01L 27/0886; H01L 27/0296; H01L 29/42356; H01L 21/823431; H01L 21/823462; H01L 21/823475; H01L 21/823481
USPC .......................................... 438/424, 296, 585
See application file for complete search history.

(56) References Cited

U.S. PATENT DOCUMENTS

| | | | |
|---|---|---|---|
| 10,276,710 B1* | 4/2019 | Li | H01L 29/42356 |
| 2008/0081404 A1* | 4/2008 | Barna | H01L 21/76232 |
| | | | 257/E21.549 |
| 2014/0073109 A1* | 3/2014 | Huang | H01L 21/76224 |
| | | | 438/424 |
| 2016/0268445 A1 | 9/2016 | Amo | |
| 2017/0278954 A1 | 9/2017 | Amo | |
| 2017/0317205 A1* | 11/2017 | Lee | H01L 21/02532 |

* cited by examiner

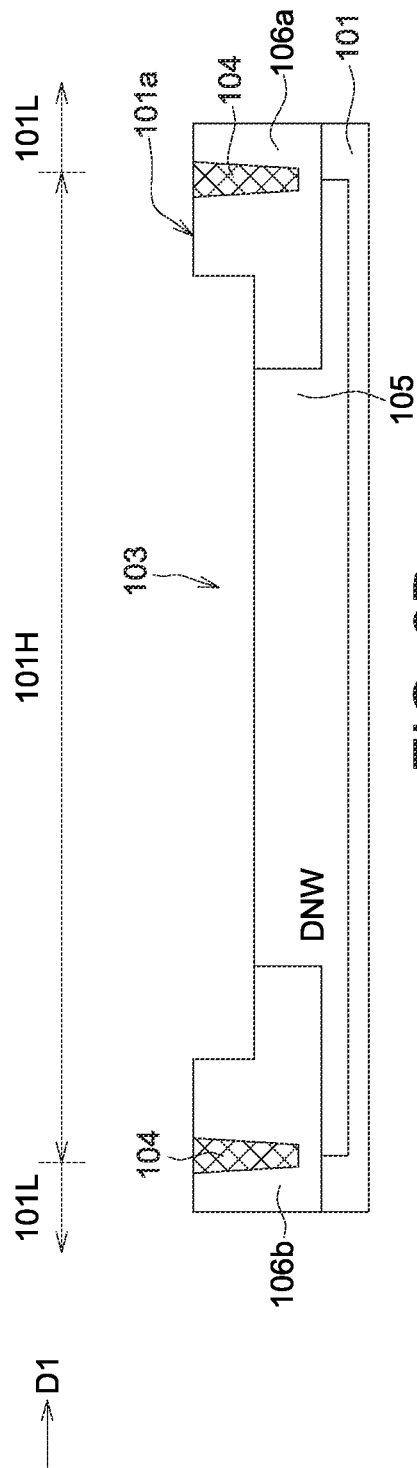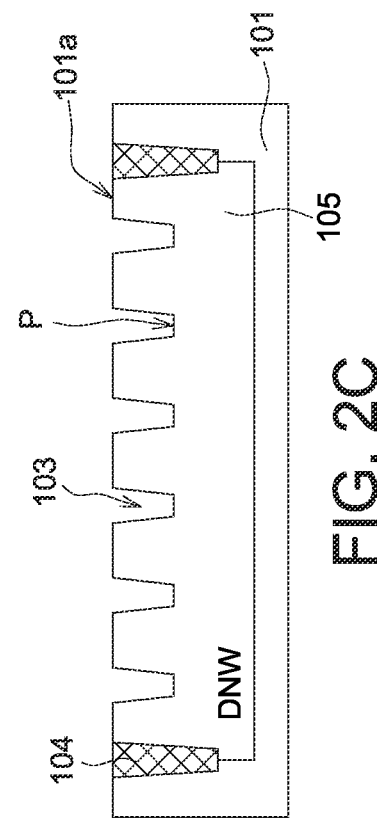

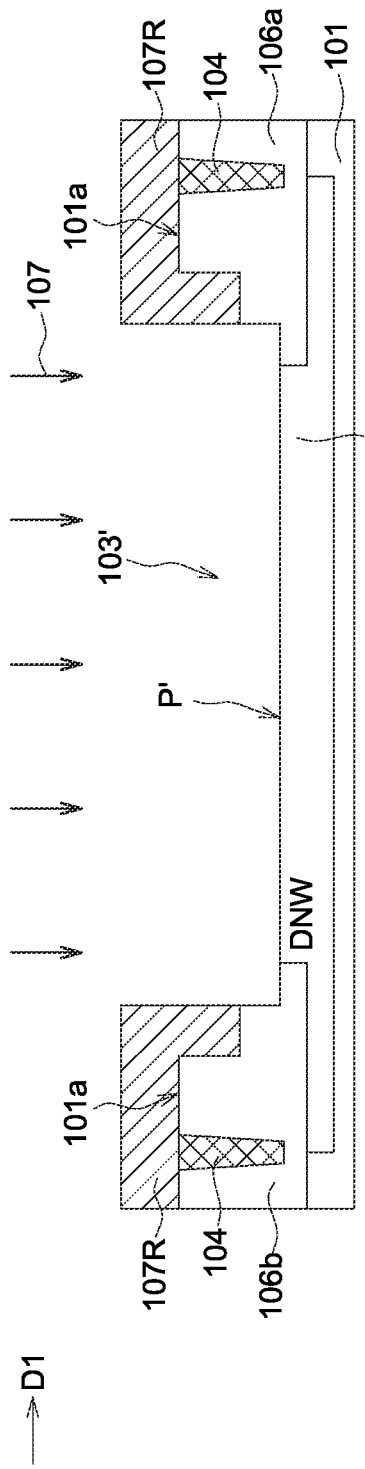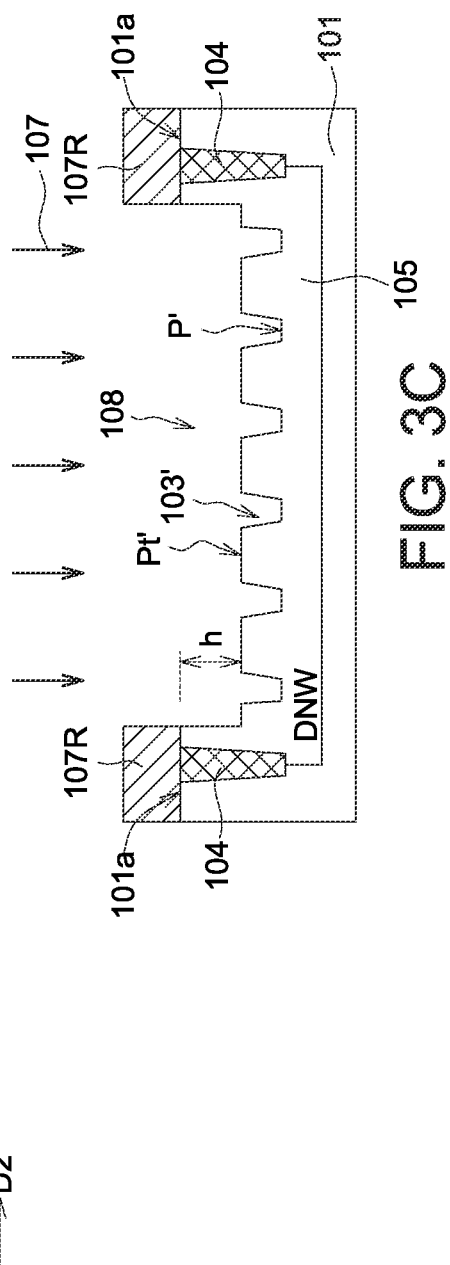

HIGH VOLTAGE TRANSISTOR DEVICE AND METHOD FOR FABRICATING THE SAME

This application is a divisional application of co-pending application Ser. No. 17/213,868, filed at Mar. 26, 2021, which claims the benefit of People's Republic of China application Serial No. 202110086666.3 filed at Jan. 22, 2021, the subject matter of which is incorporated herein by reference.

BACKGROUND

Technical Field

The disclosure relates to a semiconductor device and the method for fabricating the same, and more particularly to a high voltage transistor and the method for fabricating the same.

Description of Background

Negative bias temperature instability (NBTI) is an important factor affecting the reliability of a metal oxide semiconductor field effect transistor (for example, a high voltage transistor device). When the high-voltage transistor device is operated at high temperature or high current density, the high temperature or high current density may cause the Si—H bonds that are disposed at the interface between the gate and gate dielectric layer being broken, and may result in dangling bonds and oxide layers formed at the interface to fix positive charges; and this may cause the threshold voltage of the high-voltage transistor device shifted, so as to adversely affect the service life thereof, or event make it failed.

It is currently known that increasing the thickness of the gate dielectric layer can reduce the influence of NBTI of the high-voltage transistor device. However, the thickness of the gate dielectric layer is inversely proportional to the driving current (Ion) of the high-voltage transistor device. Increasing the thickness of the gate dielectric layer may reduce the driving current of the high-voltage transistor device, so as to adversely affect its efficiency. How to reduce the NBTI of the high-voltage transistor device while taking into account the performance of the devices that is proportional to their driving current has become one of the important issues in this technical field.

Therefore, there is a need of providing a high voltage transistor and the method for fabricating the same.

SUMMARY

One aspect of the present disclosure is to provide a high-voltage transistor device, wherein the high-voltage transistor device includes a semiconductor substrate, an isolation structure, a gate dielectric layer, a gate, a source region and a drain region. The semiconductor substrate has a plurality of grooves extending downward from a surface of the semiconductor substrate to form a sawtooth sectional profile. The isolation structure is disposed on the outside of the plurality of grooves, and extends from the surface downwards into the semiconductor substrate to define a high-voltage area. The gate dielectric layer is disposed on the high-voltage area and partially filled in the plurality of grooves. The gate is disposed on the gate dielectric layer. The source region and the drain region are respectively disposed in the semiconductor substrate and isolated from each other.

Another aspect of the present disclosure is to provide a method for fabricating a high-voltage transistor device, wherein the method includes steps as follows: Firstly, a semiconductor substrate is provided. The semiconductor substrate is then etched by using a first patterned mask to form a plurality of grooves extending downward from a surface of the substrate to form a sawtooth sectional profile. Next, an isolation structure is formed on the outside of the plurality of grooves, and extending downwards from the surface into the semiconductor substrate, thereby defining a high-voltage area. Thereafter, the high-voltage area is etched by using a second patterned mask. A gate dielectric layer is formed on the high-voltage area and partially filled in the plurality of grooves. A gate is formed on the gate dielectric layer. A source region and a drain region are respectively formed in the semiconductor substrate and isolated from each other.

In accordance with the aforementioned embodiments of the present disclosure, a high-voltage transistor device and the method for fabricating the same are provided. Before the isolation structure that is formed to define the doped well (portion of which serves as the channel of the high-voltage transistor device), a high-voltage area of the substrate used to form the high-voltage transistor device can be etched by an etching process used for forming other device (such as, a logic device), wherein the etching process uses a first patterned mask to make the high-voltage area of substrate having a plurality of grooves substantially parallel to the direction extending along the channel length (perpendicular to the channel width direction). After the doped well of the high-voltage transistor device is formed, another etching process using a second patterned mask is performed to remove a portion of the doped well. Whereby a sawtooth structure substantially parallel to the direction of the channel width can be formed on the interface between the doped well and the gate dielectric layer of the high-voltage transistor device.

Therefore, the channel width of the high-voltage transistor device can be lengthened without reducing the thickness of the gate dielectric layer, so as to reduce (or not induce) the NBTI and improve the driving current and the efficacy of the high-voltage transistor device.

BRIEF DESCRIPTION OF THE DRAWINGS

The above objects and advantages of the present disclosure will become more readily apparent to those ordinarily skilled in the art after reviewing the following detailed description and accompanying drawings, in which:

FIG. 2B is a schematic cross-sectional view illustrating the structure taken along the section line S21 as depicted in FIG. 2A;

FIG. 2C is a schematic cross-sectional view illustrating the structure taken along the section line S22 as depicted in FIG. 2A;

FIG. 3B is a schematic cross-sectional view illustrating the structure taken along the section line S31 as depicted in FIG. 3A;

FIG. 3C is a schematic cross-sectional view illustrating the structure taken along the section line S32 as depicted in FIG. 3A;

DETAILED DESCRIPTION

Figure 1A:
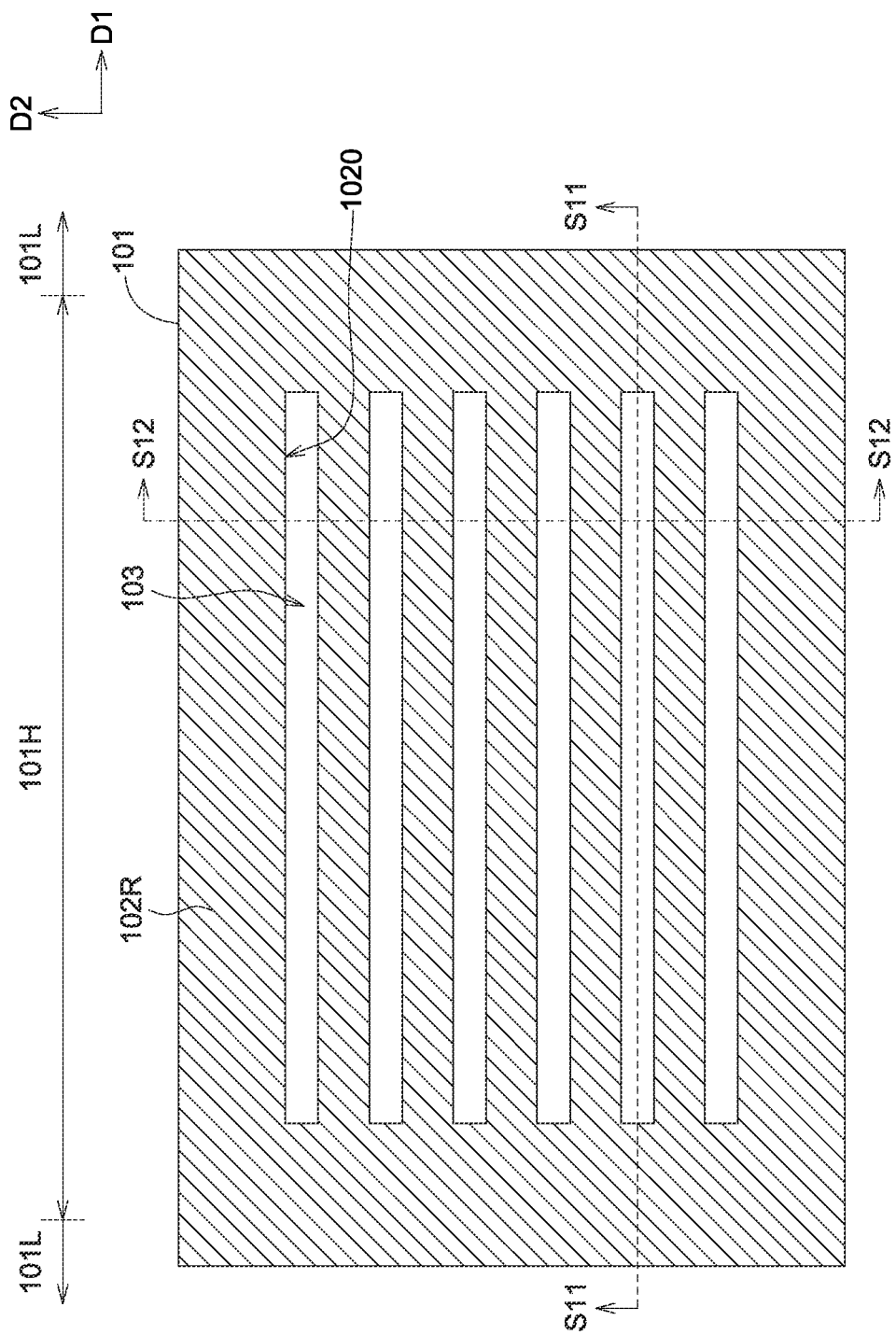
FIG. 1A is a schematic top view illustrating a partial structure of a semiconductor substrate after a plurality of grooves are formed therein, according to one embodiment of the present disclosure.

The present disclosure as illustrated below provide a high-voltage transistor device and the method for fabricating the same, which can reduce the NBTI and improve the driving current and the efficacy of the high-voltage transistor device. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regarded as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

The method for manufacturing the high-voltage transistor device 100 includes the following steps: Firstly, a semiconductor substrate 101 is provided; and a first etching process 102 is performed using a first patterned mask 102R to etch the semiconductor substrate 101 for forming a plurality of grooves 103 extend downward from the surface 101a of the semiconductor substrate 101, so as to make the patterned semiconductor substrate 101 has a sawtooth sectional profile P.

Figure 1B:
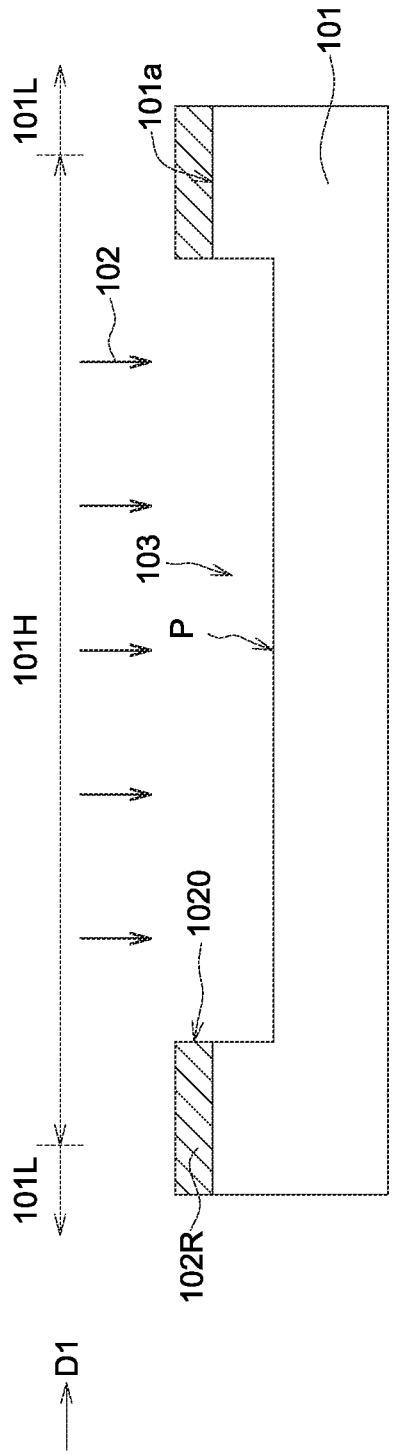
FIG. 1B is a schematic cross-sectional view illustrating a partial structure of the semiconductor substrate taken along the section line S11 as depicted in FIG. 1A.
Figure 1C:
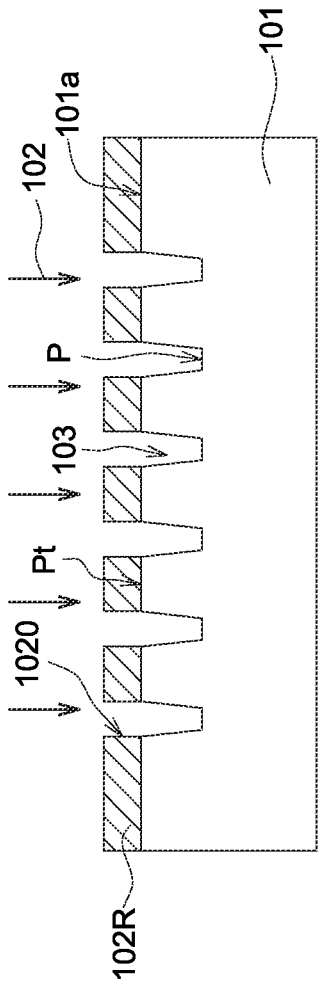
FIG. 1C is a schematic cross-sectional view illustrating a partial structure of the semiconductor substrate taken along the section line S12 as depicted in FIG. 1A.

FIG. 1A is a schematic top view illustrating a partial structure of the semiconductor substrate 101 after the plurality of grooves 103 are formed in the semiconductor substrate 101 according to one embodiment of the present disclosure; FIG. 1B is a schematic cross-sectional view illustrating a partial structure of the semiconductor substrate 101 taken along the section line S11 as depicted in FIG. 1A; and FIG. 1C is a schematic cross-sectional view illustrating a partial structure of the semiconductor substrate 101 taken along the section line S12 as depicted in FIG. 1A.

In the present embodiment, the semiconductor substrate 101 may include a logic area 101L and a high-voltage area 101H. The first patterned mask 102R may be a patterned photoresist layer, both covering the logic area 101L and the high-voltage area 101H of the semiconductor substrate 101, and having a plurality of patterned openings (for example, the openings 102O) respectively disposed in different areas of the semiconductor substrate 101 for at least exposing portions of the logic area 101L and the high-voltage area 101H of the semiconductor substrate 101. Therefore, the first etching process 102 not only can form a plurality of grooves 103 in the high-voltage area 101H, but also can form other etching patterns (not shown) in other areas of the semiconductor substrate 101 (for example, the logic area 101L).

After that, a series of intermediate manufacturing processes are performed to form other device structures in other regions of the semiconductor substrate 101, for example (but not limited to) a plurality of logic devices (not shown) in the logic area 101L. Then, an isolation structure 104 is formed on the outside of the plurality of grooves 103 in the high-voltage area 101H, which extends downward from the substrate surface 101a into the semiconductor substrate 101 to define the boundary of the high-voltage area 101H.

Figure 2A:
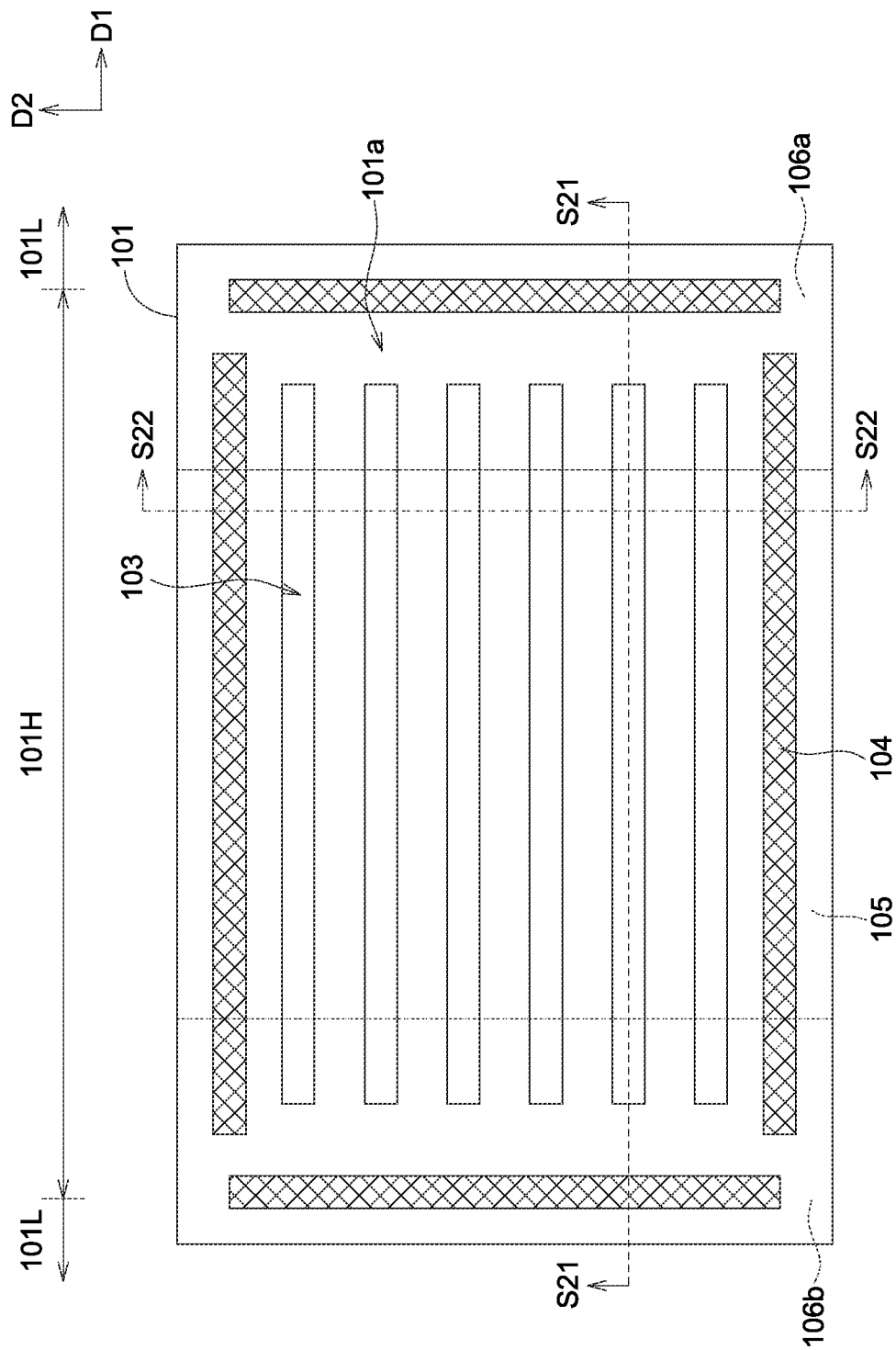
FIG. 2A is a schematic top view illustrating the result after an isolation structure is formed in the high-voltage area of the semiconductor substrate.

FIG. 2A is a schematic top view illustrating the result after the isolation structure 104 is formed in the high-voltage area 101H of the semiconductor substrate 101; FIG. 2B is a schematic cross-sectional view illustrating the structure taken along the section line S21 as depicted in FIG. 2A; and FIG. 2C is a schematic cross-sectional view illustrating the structure taken along the section line S22 as depicted in FIG. 2A. In the present embodiment, the isolation structure 104 may be a shallow trench isolation structure (STI). And the isolation structure 104 surrounds the periphery of the plurality of grooves 103.

In some embodiments of the present disclosure, before forming the isolation structure 104, an ion implantation process may be performed on the high-voltage area 101H to form a dopped well 105 (referred as to DNW) having a first conductivity (for example, an n-type conductivity) extending downwardly into the semiconductor substrate 101 from the substrate surface 101a of the high-voltage area 101H. After the isolation structure 104 is formed, another ion implantation process can be performed on the high-voltage area 101H to form two high-voltage field doped regions 106a and 106b both having a second conductivity (for example, p-type conductivity), disposed at two ends of the plurality of grooves 103 and isolated from each other. In some embodiments of the present invention, the high-voltage field doped regions 106a and 106b may partially overlap with the two ends of the plurality of grooves 103.

Figure 3A:
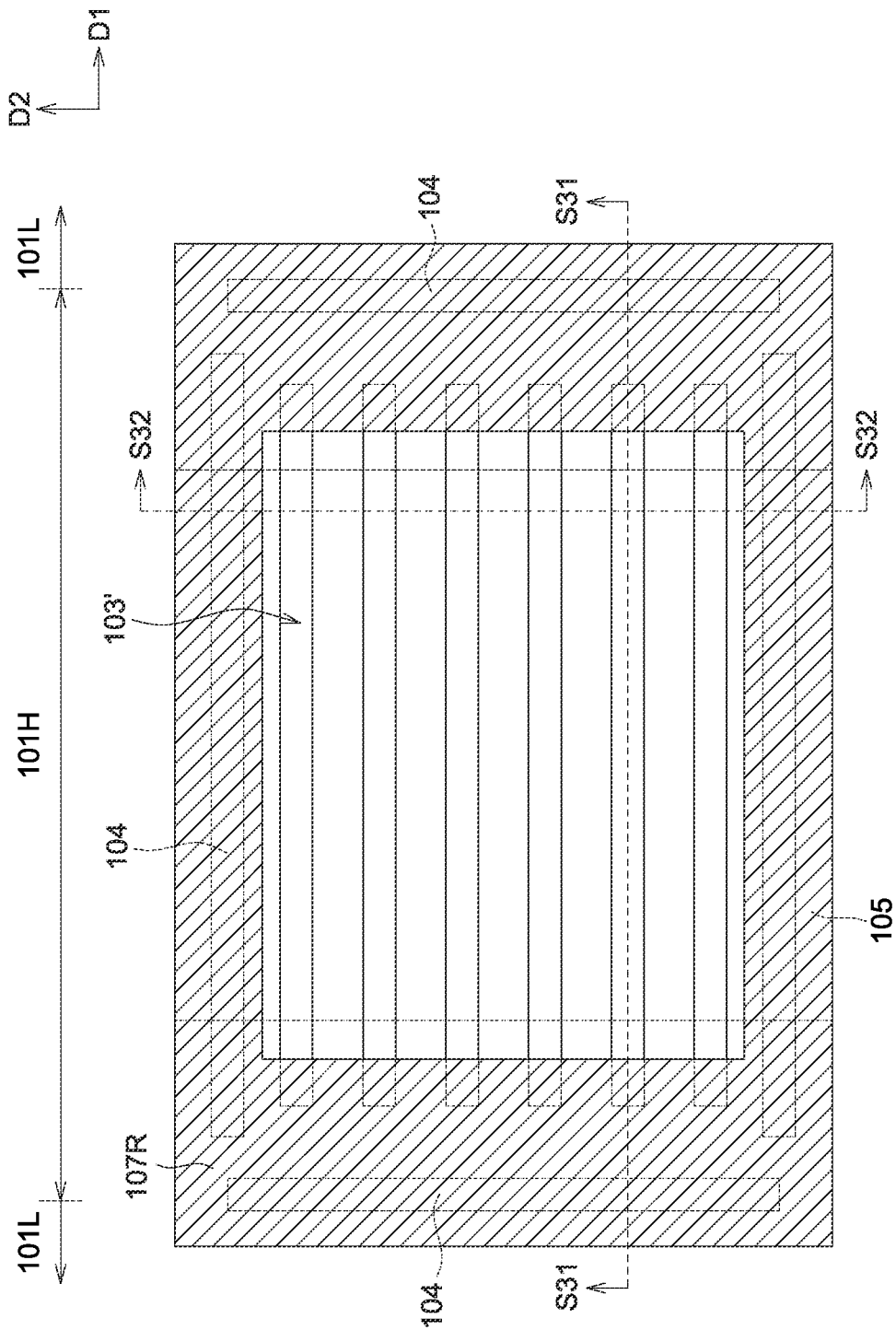
FIG. 3A is a schematic top view illustrating the result after the high-voltage area is etched by a second etching process.

Thereafter, a second etching process 107 using a second patterned mask 107R is performed on the high-voltage area 101H to remove a portion of the dopped well 105, so as to form a recess 108 in the high-voltage area 101H. FIG. 3A is a schematic top view illustrating the result after the high-voltage area 101H is etched by the second etching process 107; FIG. 3B is a schematic cross-sectional view illustrating the structure taken along the section line S31 as depicted in FIG. 3A; and FIG. 3C is a schematic cross-sectional view illustrating the structure taken along the section line S32 as depicted in FIG. 3A.

In the present embodiment, the second patterned mask 107R is a patterned photoresist layer, covering the logic area 101 L of the semiconductor substrate 101, and exposing saw-tooth profile P formed by the number of grooves 103 in the high-voltage area 101. Before the second etching process 107 is carried out, the top Pt of the sawtooth sectional profile P is substantially coplanar with the substrate surface 101a (as shown in FIG. 2C). During the second etching process 107, as a portion of the doped well 105 disposed in the high-voltage area 101H (the grooves 103) is removed, the sawtooth sectional profile P may also shift downward along the etching direction to form another sawtooth sectional profile P' constituted by a number of grooves 103' (as shown in FIG. 3C).

The top Pt' of the sawtooth sectional profile P' is substantially lower than the surface 101a of the semiconductor substrate 101. There is a distance h between the top Pt' of the sawtooth sectional profile P' and the substrate surface 101a. Each of the grooves 103' constituting the sawtooth sectional profile P' may have a structure with a wide top and a narrow bottom; and the aspect ratio of the grooves 103' (i.e. the ratio of the depth of the grooves 103' to its width) is substantially 1:10.

Subsequently, a gate dielectric layer 109 is formed above the high-voltage area 101H and partially filled in the plurality of grooves 103' and the recesses 108, to make the gate dielectric layer 109 being adjacent to the high-voltage field doped regions 106a and 106b respectively disposed on opposite ends of the plurality of grooves 103'. Wherein, the gate dielectric layer 109 has a top substantially coplanar with the substrate surface 101a. After that, a gate 110 is formed on the gate dielectric layer 109. Spacers 111 are then formed on the sidewalls of the gate dielectric layer 109, and a series of downstream manufacturing processes are performed, such as forming a metal interconnection structure (not shown), meanwhile the process for fabricating the high-voltage transistor device 100 as shown in FIGS. 4A to 4C can be implemented.

Figure 4A:
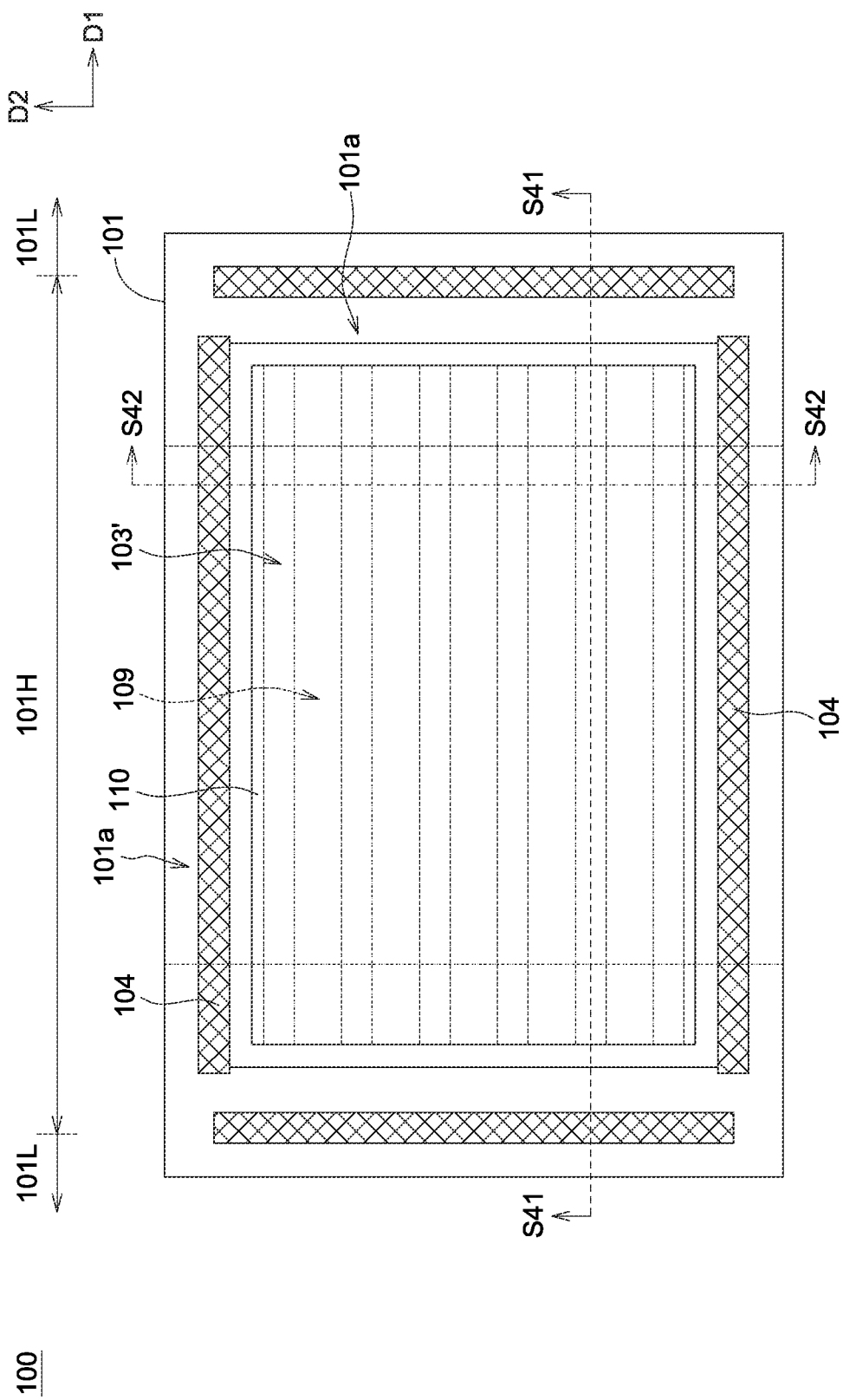
FIG. 4A is a schematic top view illustrating a partial structure of a high-voltage transistor device in one embodiment of the present disclosure.
Figure 4B:
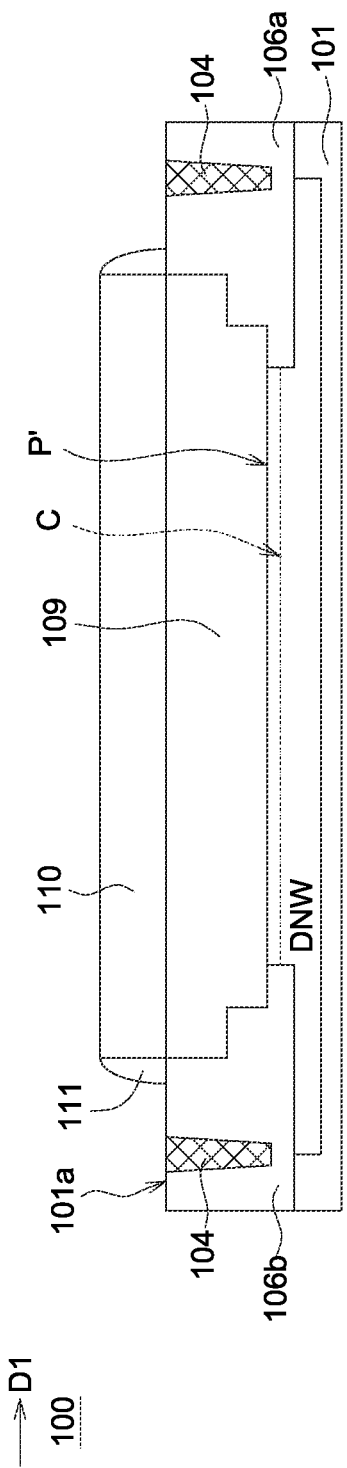
FIG. 4B is a schematic cross-sectional view illustrating the structure taken along the section line S41 as depicted in FIG. 4A.
Figure 4C:
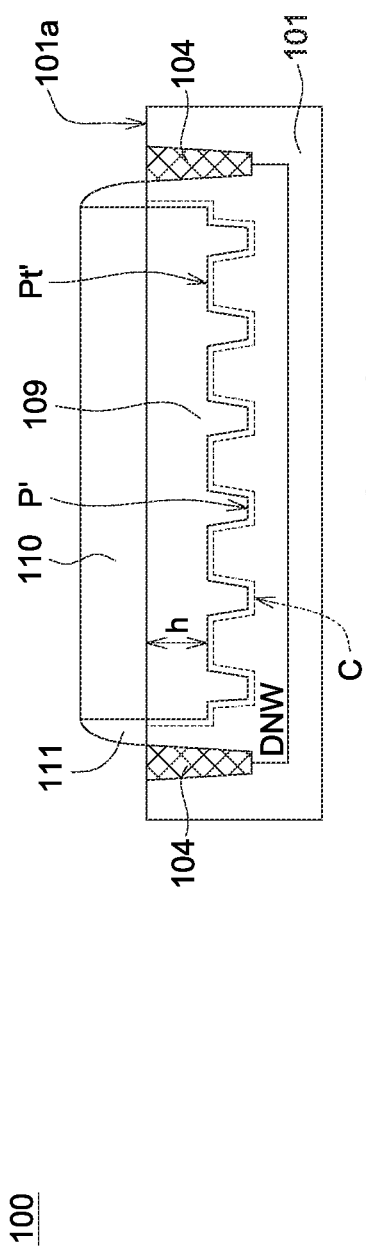
FIG. 4C is a schematic cross-sectional view illustrating the structure taken along the section line S42 as depicted in FIG. 4A.

FIG. 4A is a schematic top view illustrating a partial structure of the high-voltage transistor device 100 in one embodiment of the present disclosure; FIG. 4B is a schematic cross-sectional view illustrating the structure taken along the section line S41 as depicted in FIG. 4A; and FIG. 4C is a schematic cross-sectional view illustrating the structure taken along the section line S42 as depicted in FIG. 4A.

In the present embodiment, the high-voltage field doped regions 106a and 106b can serve as the source/drain of the high-voltage transistor device 100, respectively. The channel region C of the high-voltage transistor element 100 can be defined on the interface formed between the portion of the doped well 105 with the sawtooth sectional profile P' and the gate dielectric layer 109, wherein the high-voltage field doped regions 106a and 106b (source and drain) are arranged along the channel length direction D1; and the saw-tooth profile P' extends along the channel width direction D2 perpendicular to the channel length direction D1.

Since the channel region C of the high-voltage transistor device 100 has the sawtooth sectional profile P', compared to the prior art high-voltage transistor device (not shown) with the same size, thus the portion of the gate dielectric layer 109 filled in the plurality of grooves 103' has a larger thickness. By this approach, the NBTI problems occurred in the prior art high-voltage transistor device can be improved, and the service life of the high-voltage transistor element 100 can be prolong. Furthermore, because the channel region C with the sawtooth sectional profile P' can substantially increase the channel width of the high-voltage transistor device 100, the driving current can be increased without increasing the critical size of the high-voltage transistor device 100.

In accordance with the aforementioned embodiments of the present disclosure, a high-voltage transistor device 100 and the method for fabricating the same are provided. Before the isolation structure 104 that is formed to define the doped well 105 (portion of which serves as the channel of the high-voltage transistor device 100), a high-voltage area 101H of the substrate 101 used to form the high-voltage transistor device 100 can be etched by an etching process 102 used for forming other device (such as, a logic device), wherein the etching process 102 uses a first patterned mask 102R to make the high-voltage area 101H of substrate 101 having a plurality of grooves 103 substantially parallel to the channel length direction D1 (perpendicular to the channel width direction D2). After the doped well 105 of the high-voltage transistor device 100 is formed, another etching process 107 using a second patterned mask 107R is performed to remove a portion of the doped well 105. Whereby a sawtooth structure (with a sawtooth sectional profile P') substantially parallel to the channel width direction D2 can be formed on the interface between the doped well 105 and the gate dielectric layer 109 of the high-voltage transistor device 100.

Therefore, the channel width of the high-voltage transistor device 100 can be lengthened without reducing the thickness of the gate dielectric layer 109, so as to reduce (or not induce) the NBTI and improve the driving current and the efficacy of the high-voltage transistor device 100.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a high-voltage transistor device, comprising:
providing a semiconductor substrate;
etching a portion of the semiconductor substrate using a first patterned mask to form a plurality of grooves extending downward from a surface of the semiconductor substrate to form a sawtooth sectional profile;
forming an isolation structure, on an outside of the plurality of grooves, and extending from the surface downwards into the semiconductor substrate to defining a high-voltage area;
etching another portion of the semiconductor substrate in the high-voltage area using a second patterned mask;
forming a gate dielectric layer, on the high-voltage area and partially filled in the plurality of grooves and contacting to a bottom of the plurality of grooves;
forming a gate, on the gate dielectric layer;
forming a source region, in the semiconductor substrate; and
forming a drain region, in the semiconductor substrate and isolated from the source region.

2. The method according to claim 1, prior to etching the another portion of the semiconductor substrate in the high-voltage area, further comprising:
forming a doped well having a first conductivity on the high-voltage area; and
forming two high-voltage field doped regions both having a second conductivity and isolated with each other.

3. The method according to claim 2, wherein the step of etching the high-voltage area using the second patterned mask comprises removing portions of the doped well from the plurality of grooves to make a top of the sawtooth sectional profile departing from the surface of the semiconductor substrate for a distance.

* * * * *